(12) United States Patent
Weis

(10) Patent No.: US 6,448,610 B2
(45) Date of Patent: Sep. 10, 2002

(54) MEMORY CELL WITH TRENCH, AND METHOD FOR PRODUCTION THEREOF

(75) Inventor: Rolf Weis, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/801,212

(22) Filed: Mar. 7, 2001

(30) Foreign Application Priority Data

Mar. 7, 2000 (DE) .......................................... 100 11 889

(51) Int. Cl.⁷ .............................................. H01L 29/72
(52) U.S. Cl. ........................ 257/330; 257/68; 257/71; 257/301; 257/302; 257/304; 257/311; 257/618
(58) Field of Search ........................... 257/300, 71, 68, 257/302, 304, 311, 330, 618

(56) References Cited

U.S. PATENT DOCUMENTS

| | | |
|---|---|---|
| 4,854,537 A | 8/1989 | Nishimura et al. |
| 5,177,576 A | 1/1993 | Kimura et al. |
| 5,208,657 A | 5/1993 | Chatterjee et al. |
| 5,316,962 A | 5/1994 | Matsuo et al. |
| 5,744,386 A * | 4/1998 | Kenney ..................... 257/300 |
| 5,937,296 A | 8/1999 | Arnold |
| 5,977,579 A | 11/1999 | Noble |

* cited by examiner

Primary Examiner—Edward Wojciechowicz
(74) Attorney, Agent, or Firm—Laurence A. Greenberg; Werner H. Stemer; Gregory L. Mayback

(57) ABSTRACT

The invention relates to a memory cell that has a trench. A trench capacitor is configured in the trench. In addition, a vertical transistor is formed in the trench, above the trench capacitor. To connect the gate material of the vertical transistor to a word line, a dielectric layer (12) having an internal opening (13) is provided in the trench (3) above the gate material (23). The dielectric layer is in the form of a dielectric ring. The dielectric ring allows self-aligned connection of the word line to the gate material of the vertical transistor.

13 Claims, 10 Drawing Sheets

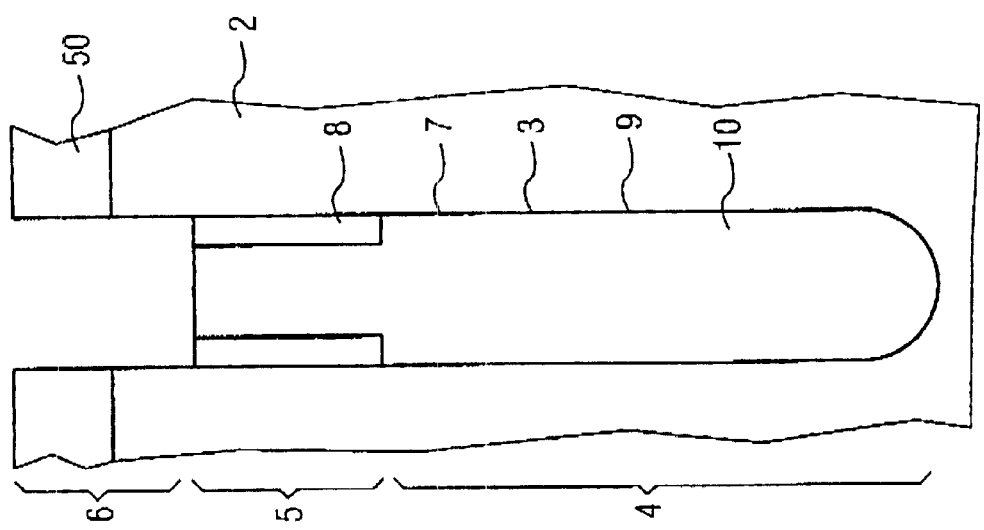
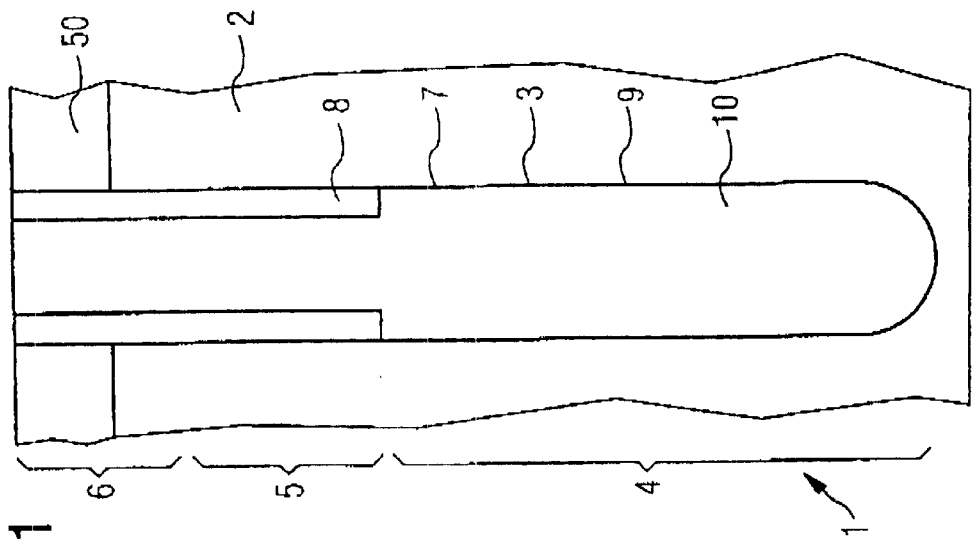

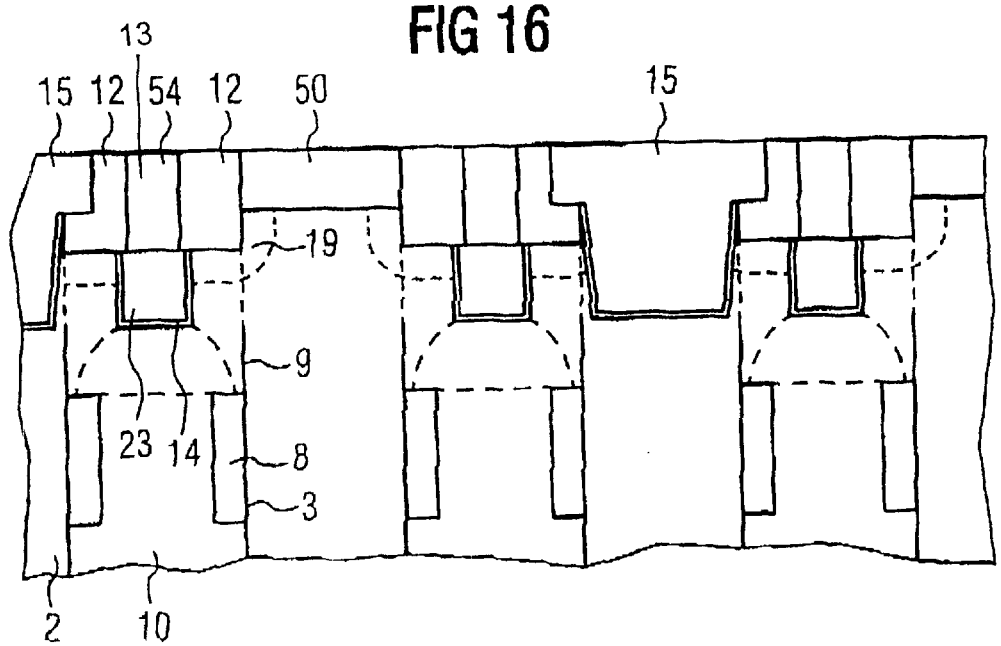
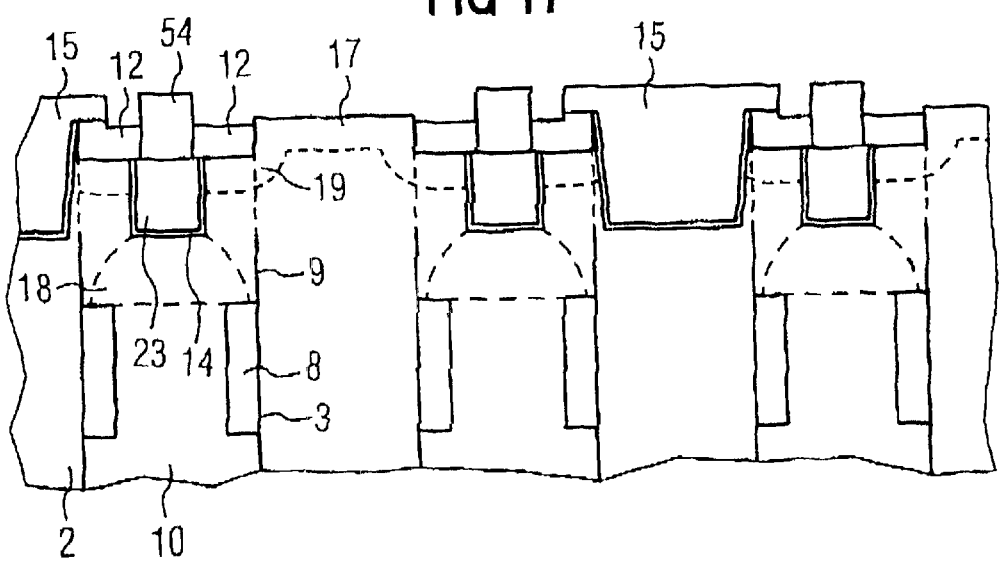

MEMORY CELL WITH TRENCH, AND METHOD FOR PRODUCTION THEREOF

BACKGROUND OF THE INVENTION

Field of the Invention

The present invention relates to a memory cell with a trench which is formed in a substrate. The trench is suitable for configuring a trench capacitor and a vertical transistor above the trench capacitor in the trench.

Memory components, such as DRAMs (dynamic random access memories) include a cell array and a driving peripheral area, with individual memory cells configured in the cell array.

A DRAM chip holds a matrix of memory cells which are configured in the form of rows and columns and are driven by word lines and bit lines. Data are read from the memory cells or data are written to the memory cells by activating suitable word lines and bit lines.

Normally, a DRAM memory cell contains a transistor connected to a capacitor. The transistor includes, amongst other things, two diffusion regions isolated from one another by a channel which is controlled by a gate. Depending on the direction of the flow of current, one diffusion region is called the drain region and the other diffusion region is called the source region.

One of the diffusion regions is connected to a bit line, the other diffusion region is connected to a capacitor, and the gate is connected to a word line. By applying suitable voltages to the gate, the transistor is controlled such that a flow of current between the diffusion regions through the channel is turned on and off.

The integration density is continuously increasing because of advancing miniaturization of memory components. The continuous increase in the integration density means that the area available for each memory cell is being reduced further and further.

In order to utilize the available area effectively, the resulting transistor can be formed above a trench capacitor as a vertical transistor in a trench. A memory cell of this generic type having a trench capacitor and a vertical transistor is described in issued U.S. Pat. No. 5,744,386. Further details relating to trench capacitors or transistors are described in issued U.S. Pat. Nos. 5,177,576; 5,937,296; 5,977,579 and 5,208,657. However, a problem with the known variants of memory cells is that of connecting the gate of the vertical transistor to a word line and of connecting the drain contact of the vertical transistor to a bit line. With advancing miniaturization, the demands on these two connections in terms of alignment accuracy will increase further.

SUMMARY OF THE INVENTION

It is accordingly an object of the invention to provide a memory cell and a method for producing the memory cell which overcomes the above-mentioned disadvantageous of the prior art apparatus and methods of this general type. In particular, it is an object of the invention to provide an improved memory cell having a trench and an epitaxially grown layer enables the production processes to have increased alignment tolerances.

With the foregoing and other objects in view there is provided, in accordance with the invention, a memory cell that includes: a substrate; a trench which has a bottom region, a middle region, a top region and an inner wall and is configured in the substrate; an insulating collar which is configured in the middle region on the inner wall of the trench; a dielectric layer which is configured at least in the bottom region of the trench; a conductive trench filling which at least partially fills the bottom region and the middle region of the trench; an epitaxially grown layer which is configured in the top region of the trench on the inner wall of the trench and on the conductive trench filling; and a second dielectric layer that is configured in the top region of the trench and above the epitaxially grown layer. The second dielectric layer has an internal opening formed therein.

In this case, the channel of the vertical transistor is formed in the epitaxially grown layer and is provided with a gate oxide. The gate material is situated on the gate oxide.

The advantage of the second dielectric layer is that it can be used to form the gate connection from the word line to the gate material of the vertical transistor in a self-aligned manner.

In this context, the second dielectric layer serves as a mask for etching free the gate material when connecting it to the word line. The advantage of this is that the only alignment tolerances which have to be observed are much greater, which affords the opportunity to advance the miniaturization process further.

Another advantage is that the trench can be designed to be wider than the contacts and wider than the word line in order to utilize the existing area more efficiently, since the etching process automatically exposes the internal opening in the second dielectric layer. This permits a lower level of safety precautions and a space-saving word line layout.

With the foregoing and other objects in view there is also provided, in accordance with the invention14. A method for producing a memory cell, which comprises: forming a trench in a substrate; forming the trench with an inner wall and with a bottom region, a middle region, and a top region; forming an insulating collar on the inner wall of the trench and in the middle region thereof; forming a dielectric layer at least in the bottom region of the trench; forming a conductive trench filling in the bottom region of the trench on the dielectric layer; forming the conductive trench filling to be at least partially disposed in the middle region of the trench and on the insulating collar; epitaxially growing a layer on the inner wall, in the top region of the trench, and on the conductive trench filling; while epitaxially growing the layer, forming a trench therein; filling the trench formed in the epitaxially grown layer with a gate material; and disposing a second dielectric layer with an internal opening formed therein in the top region of the trench formed in the substrate and above the epitaxially grown layer.

In accordance with an added feature of the invention, a third dielectric layer is configured on the epitaxially grown layer below the second dielectric layer. In this configuration, the third dielectric layer is a gate oxide. In this case, it is advantageous that the gate oxide is produced on the epitaxially grown layer and insulates the channel from a gate material. The opening in the second dielectric layer is in this case smaller than the diameter of the gate material.

In accordance with an additional feature of the invention, an insulating trench is configured such that it surrounds the memory cell and an adjacent memory cell, and an active region which is doped is formed between the memory cell and the adjacent memory cell. This configuration connects two adjacent memory cells to an active region, on which the bit line contact can later be formed.

In accordance with another feature of the invention, the channel region of the vertical transistor is not insulated, as would be the case in an SOI transistor (silicon on insulator).

The bulk connection improves the control response of the vertical transistor, and it can be put into the off state again by a suitable gate voltage. In addition, the insulating trench has the task of insulating the memory cell and the adjacent memory cell from the other memory cells, which reduces and prevents leakage currents.

In accordance with a further feature of the invention, the epitaxially grown layer has a bottom doped region, which is connected to the conductive trench filling, and a top doped region, which is connected to the active region. The doped regions represent the source region and the drain region of the vertical transistor.

In accordance with a further added feature of the invention, a bit line runs via the active region and makes contact with the active region. In this case, part of the bit line is routed over the insulating trench, and part is routed via the active region, thus making contact with the latter. This configuration means that the bit line has a low line capacitance, which is particularly advantageous when a memory cell is being read, since the ratio of bit line capacitance to memory cell capacitance should be as small as possible for reading so that the charge stored in the memory cell is able to reverse the charge on the bit line. In addition, the bit line can be formed from a low-impedance material, which makes the memory cell fast.

In accordance with a further additional feature of the invention, the bit line is encapsulated in a dielectric sheath. The dielectric sheath can be used as a self-aligning etching mask when the contact hole for the gate connection is etched, and can thus improve the alignment tolerance of the memory cell.

In accordance with yet an added feature of the invention, a gate material is configured on the third dielectric layer and extends at least to the internal opening in the second dielectric layer. In addition, a gate connection is configured on the gate material and extends through the internal opening in the second dielectric layer and through a glass layer to a word line, which may be configured on the glass layer. This configuration ensures that the gate material is connected to a word line through the internal opening in the second dielectric layer. In addition, it is advantageously possible to form the gate connection in a self-aligned fashion.

In accordance with yet an additional feature of the invention, the word line runs above the bit line. This configuration permits a low coupling capacitance between the bit line and the word line, which becomes advantageously apparent as a result of low crosstalk from the word line to the bit line when a memory cell is read. In addition, this reduces the total bit line capacitance, which increases the speed of the memory cell and improves reading reliability.

In accordance with yet another feature of the invention, a circuit peripheral area has transistors with gate electrodes, and the gate electrodes are formed in one process step with the bit line. The combination of production steps in the circuit peripheral area, which contains the drive logic for the memory cell array, with production steps for layers and structures in the cell array allows the production costs for a memory to be reduced. It is therefore very effective to produce the gate electrodes of the transistors in the switching peripheral area in one step with the bit line in the cell array.

In accordance with a concomitant feature of the invention, further trenches are configured next to the trench in a predominantly hexagonal pattern. The advantage of this configuration is that the available surface can be utilized in optimum fashion, since a hexagonal configuration of the trenches represents the highest packing density in a two-dimensional configuration. This allows each individual trench to be configured such that its distance from its next adjacent trench is uniform.

Other features which are considered as characteristic for the invention are set forth in the appended claims.

Although the invention is illustrated and described herein as embodied in a memory cell with trench, and method for production thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a trench capacitor;

FIG. 2 to FIG. 12 show successive steps for producing the trench capacitor shown in FIG. 1;

FIG. 14 to FIG. 19 show successive steps for the trench capacitor shown in FIG. 12;

DESCRIPTION OF THE PREFERRED EMBODIMENTS

Figure 3:
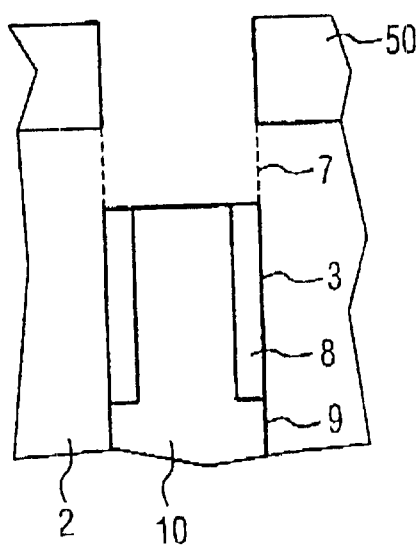

In the figures, identical reference symbols denote elements which are the same or have the same function. Referring now to the figures of the drawing in detail and first, particularly, to FIG. 1 thereof, there is shown a memory cell 1 which includes a trench 3 that is formed in a substrate 2. In this illustrative embodiment, the substrate 1 is made of silicon which can be doped with boron, phosphorus or arsenic. In this case, the trench 3 has a bottom region 4, a middle region 5 and a top region 6. In addition, the trench 3 has an inner wall 7. An insulating collar 8 is configured on the inner wall in the middle region 5 and the top region 6 of the trench 3. The insulating collar is usually made of silicon oxide. In addition, the substrate 2 has a hard mask 50 on it, which is used as an etching mask for etching the trench 3. The hard mask 50 is made of silicon nitride, for example. The bottom region 4 of the inner wall 7 of the trench 3 is lined with a dielectric layer 9. In addition, the dielectric layer 9 may optionally be situated in the middle region 5, and/or in the top region 6, on the insulating collar 8 or under the insulating collar 8, i.e. on the inner wall 7 of the trench. The trench 3 is additionally filled with a conductive trench filling 10. The conductive trench filling 10 is made of doped silicon, for example. The conductive trench filling 10 serves as an inner capacitor electrode, and the substrate 2 on the outside serves as an outer capacitor electrode. The capacitor dielectric is formed by the dielectric layer 9.

A production method for forming the memory cell shown in FIG. 1 includes depositing a hard mask 50, which is usually made of silicon nitride. By way of example, an LPCVD (low pressure chemical vapor deposition) method is used to produce the hard mask 50. The hard mask 50 is then structured and used as an etching mask for etching the trench 3. Once the trench 3 has been etched, it is lined with a dielectric layer 9. The dielectric layer 9 is usually made of a silicon oxide, silicon nitride or of a combination of the two, such as an oxynitride, which is formed by thermal and by CVD methods. In a subsequent method step, the insulating collar 8 is formed in the middle and top regions 5, 6 of the trench 3.

The substrate 2 is normally made of monocrystalline silicon. The insulating collar 8 is made of a silicon oxide, which is usually applied using a CVD process. In this illustrative embodiment, the conductive trench filling 10 is made of a highly-doped polysilicon, and likewise is normally put into the trench using a CVD process.

With reference to FIG. 2, the conductive trench filling 10 and the insulating collar 8 are sunk, so that they are removed from the top region 6 of the trench 3. If selected as an option, as shown in the illustrative embodiment, the dielectric layer 9 remains in the top region 6 of the trench 3 at first, since the sinking process which sinks the conductive trench filling 10 and the insulating collar 8 is selective with respect to the nitride-containing dielectric layer 9.

With reference to FIG. 3, the optionally present dielectric layer 9 is removed from the top region 6 of the trench 3 in a subsequent step. This method step exposes the substrate 2 at the inner wall 7 in the top region 6 of the trench 3.

Figure 4:
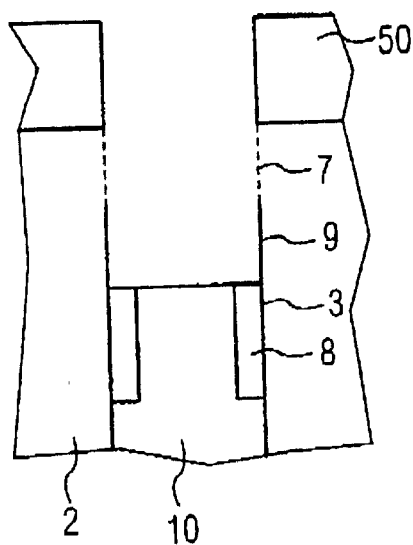

With reference to FIG. 4, a further sinking process is optionally carried out in full or in part. The process involves partially removing the conductive trench filling 10 and the insulating collar 8 from the top region 6 and the middle region 5 of the trench 3. Again, if present, the dielectric layer 9 remains on the inner wall 7 of the trench in the top region 6 and the middle region 5, since the conductive trench filling 10 and the insulating collar 8 are removed selectively with respect to the dielectric layer 9.

Figure 5:
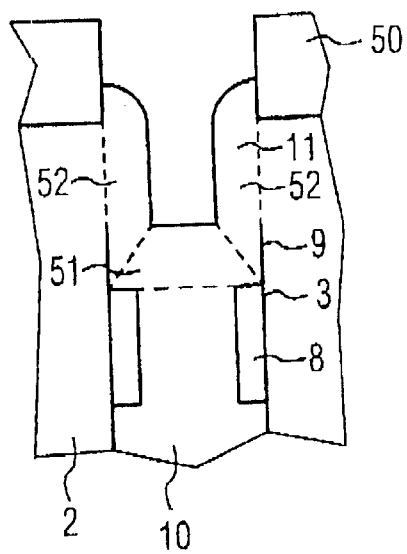

With reference to FIG. 5, an epitaxially grown layer 11 is grown in the top region 5 and in the middle region 6 of the trench 3 in an epitaxial step. In this context, the epitaxially grown silicon grows on silicon which is already present. In this case, there are two growth zones, one growth zone is a polycrystalline epitaxial layer 51 which grows on the conductive trench filling 10. The other epitaxially grown layer is a ring 52 which is grown in monocrystalline fashion and grows on the inner wall 7 of the trench 3. Optionally, doping is provided in order to set the threshold voltage of the transistor in the channel region. Furthermore, the hole formed by the epitaxially grown silicon in the trench 3 may optionally be filled in the bottom region 4 by a CVD oxide up to the level of the later outdiffusion of the bottom doping region 18, in order to reduce the transistor capacitance for the gate.

Figure 6:
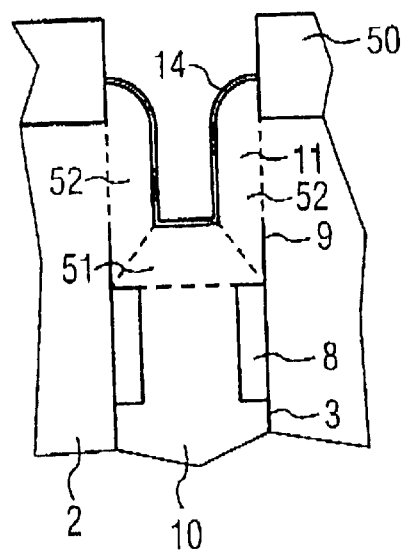

With reference to FIG. 6, a third dielectric layer 14 is formed on the epitaxially grown layer 11. The third dielectric layer 14 later serves as a gate oxide.

Figure 7:
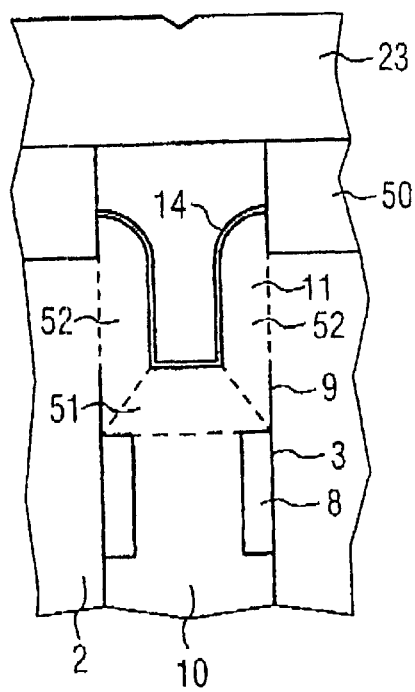
Figure 8:
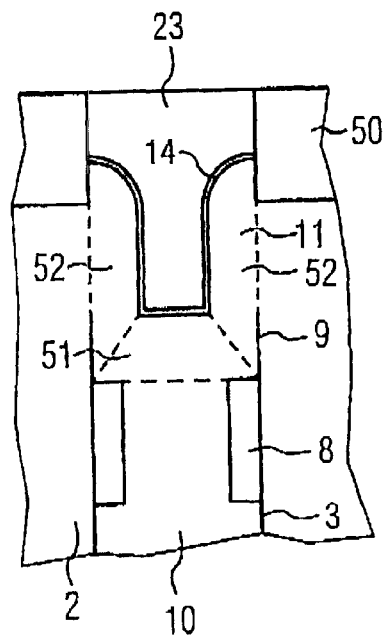

With reference to FIG. 7, a gate material 23 is formed on the substrate surface. The gate material 23 is normally a highly-doped, polycrystalline silicon. In a subsequent CMP process (chemical mechanical polishing), the gate material 23 is removed from the surface of the substrate and only remains in the trench 3 above the third dielectric layer 14 (See FIG. 8).

Figure 9:
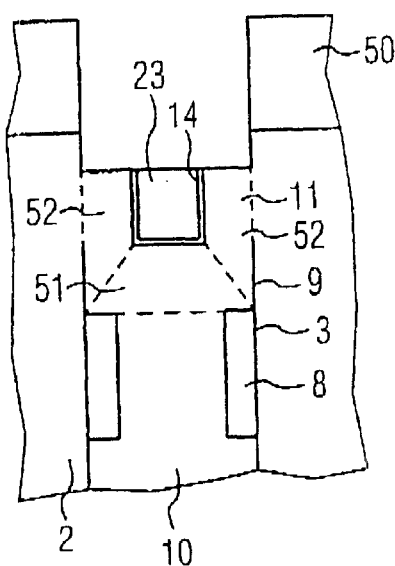

With reference to FIG. 9, a further sinking process is carried out, in which the gate material 23, the third dielectric layer 14 and the epitaxially grown layer 11 are partially removed from the top region 6 of the trench 3.

Figure 10:
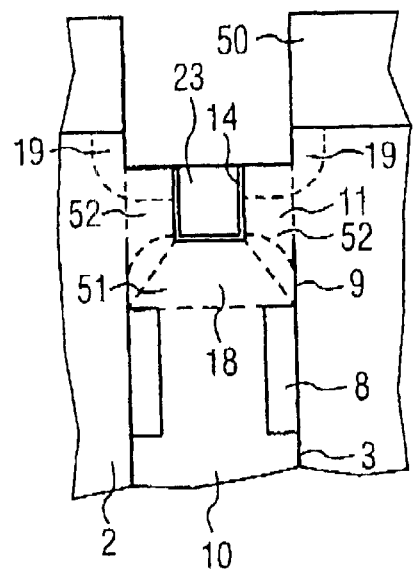

With reference to FIG. 10, dopant is introduced into the top region of the trench 3 and into the adjoining substrate 2 in a doping process. The top doping region 19 is formed by the introduced dopant. Doping can be carried out, for example, by vapor phase doping and subsequent outdiffusion. During the subsequent outdiffusion in a temperature step which is optionally oxidative, dopant likewise diffuses out of the conductive trench filling 10 into the epitaxially grown layer 11 and forms a bottom doping region 18 in the process.

Figure 11:
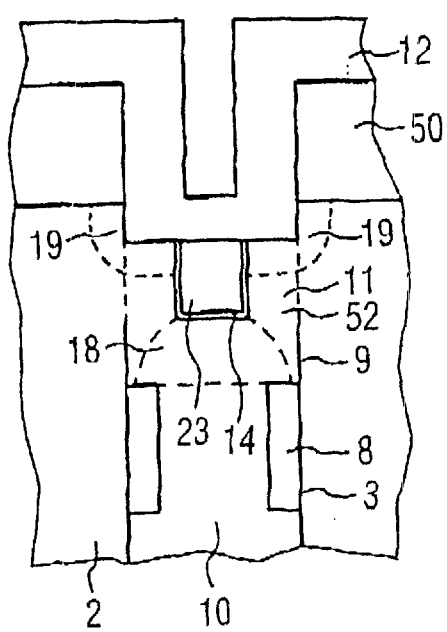

With reference to FIG. 11, a second dielectric layer 12 is deposited onto the substrate. The second dielectric layer 12 is, by way of example, a silicon nitride layer applied using a CVD process. In this case, the second dielectric layer is thicker than the epitaxially grown layer 11.

Figure 12:
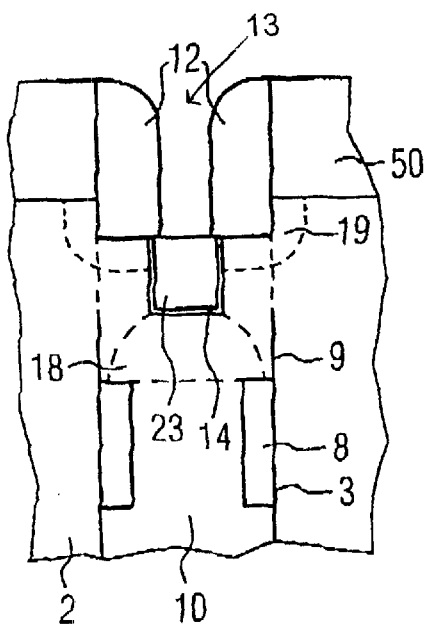

With reference to FIG. 12, anisotropic silicon nitride etching is carried out, so that the second dielectric layer 12 is removed from the hard mask 50 and remains merely as a lateral edge web (spacer) in the top region 6 of the trench 3. In this case, the second dielectric layer 12 has an internal opening 13.

Figure 13:
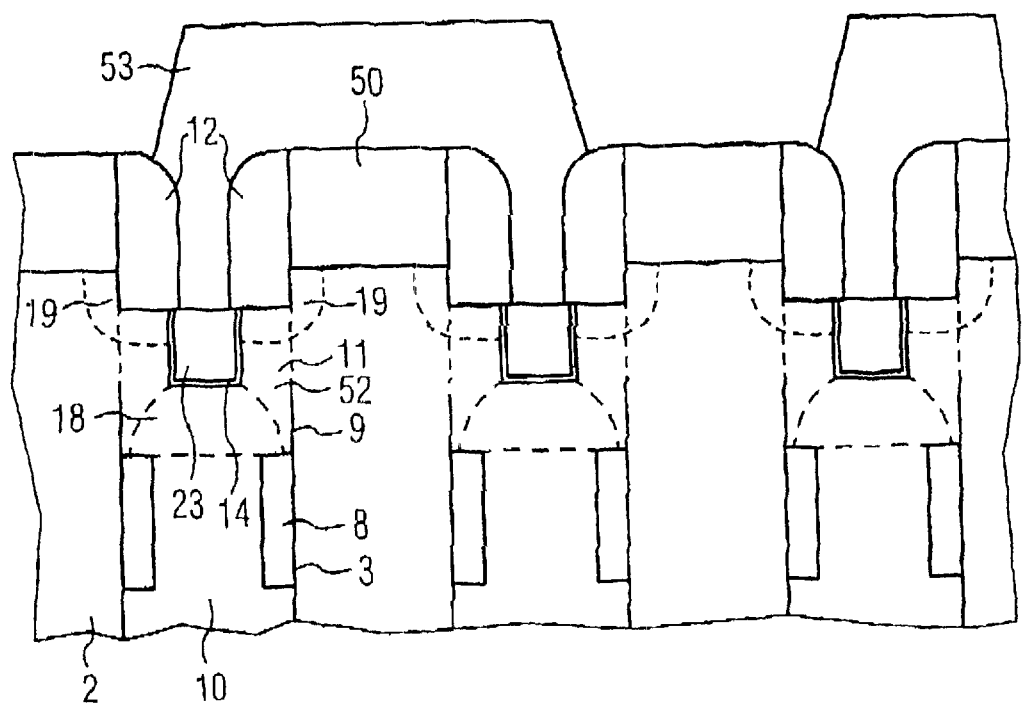
FIG. 13 shows a sectional diagram along the section line A—A from FIG. 25 at a time in the process that follows that shown in FIG. 12.

With reference to FIG. 13, a mask 53 is deposited on the substrate and is structured, so that parts of the underlying structure are exposed. In this case, the mask 53 is positioned such that it covers an area where an active region 17 will be formed (See FIGS. 17–19) and exposes the regions of the surface in which an insulating trench 15 will be formed (See FIGS. 14–16). In this context, it is particularly advantageous to choose the opening in the mask 53 such that two respective adjacent second dielectric layers 12 are at least partially exposed. The advantage is that the width of the lateral spacer web of the second dielectrical layer 12 is available as an alignment tolerance. Further alignment tolerance for forming the active regions is obtained by first filling the internal opening 13 with planarizing material. Once the thin cover layer has been opened using the mask 53, the subsequent nitride etching can be carried out selectively with respect to the planarizing material. A suitable material is, by way of example, an antireflective coating (ARC). This makes the surface of the entire trench opening available as an alignment tolerance.

Figure 14:
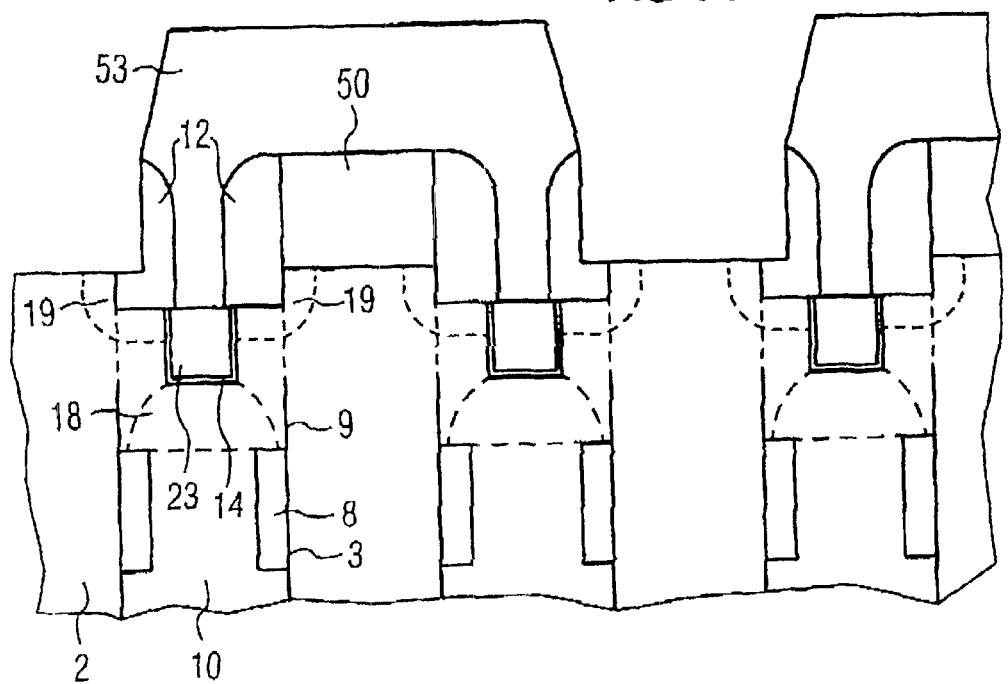
Figure 15:
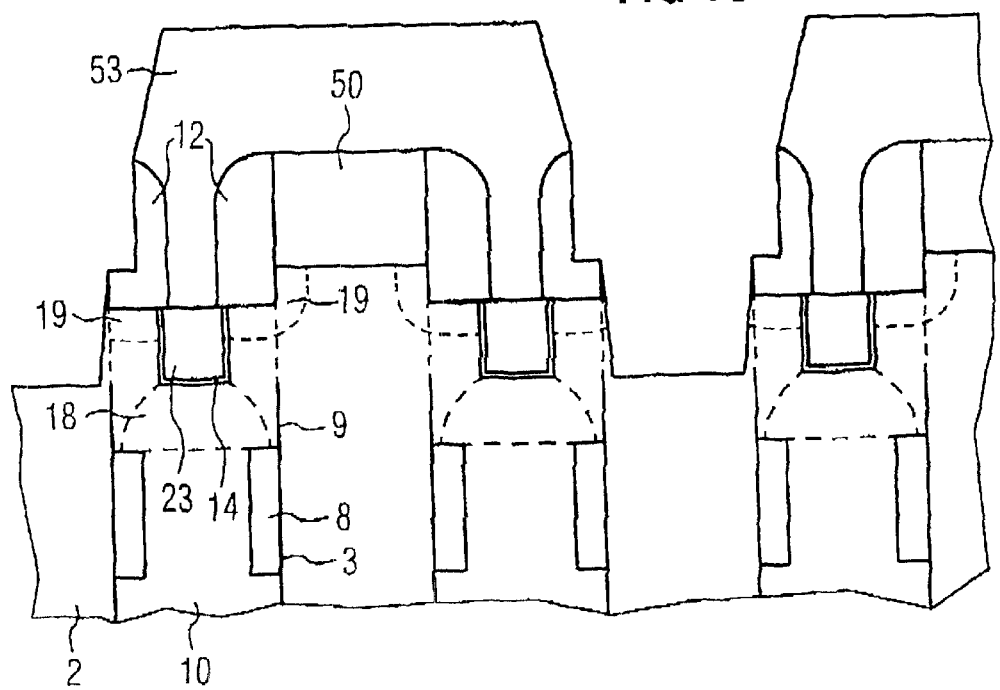

With reference to FIG. 14, a first etching step is carried out to initially form the insulating trenches 15 (See FIG. 16). With reference to FIG. 15, a second etching step is carried out to further form the insulating trenches 15. This etching process is carried out selectively with respect to the material of the second dielectric layer 12, which is made of silicon nitride in this case. This method ensures that an insulating trench 15 is formed in self-aligned fashion between adjacent trenches.

In a subsequent process (See FIG. 16), the mask 53 is removed from the substrate surface, and optionally the planarizing material is removed from the opening 13. Thermal oxidation of the opened insulating trenches is carried out, and then an oxide is deposited, for example using an HDP oxide (high density pressure oxide), which forms the insulating trenches 15 and forms the oxide filling 54 in the internal opening 13 in the second dielectric layer 12. The surface is then planarized using a CMP process.

With reference to FIG. 17, the second dielectric layer 12 is sunk, and the hard mask 50 is removed from the substrate surface. This can be carried out in one step, since the hard mask 50 and the second dielectric layer 12 are made of silicon nitride, which can be etched selectively using hot phosphoric acid. Next, a sacrificial oxide layer is grown thermally. The sacrificial oxide layer is used as a screen oxide during subsequent implantation of the active region 17. Doping by vapor phase doping or plasma ion immersion implantation is likewise possible. After the doping, the sacrificial oxide is removed, and the surface of the active region 17 may optionally be cleaned by growing a further thermal oxide and removing it using hydrofluoric acid.

Figure 18:
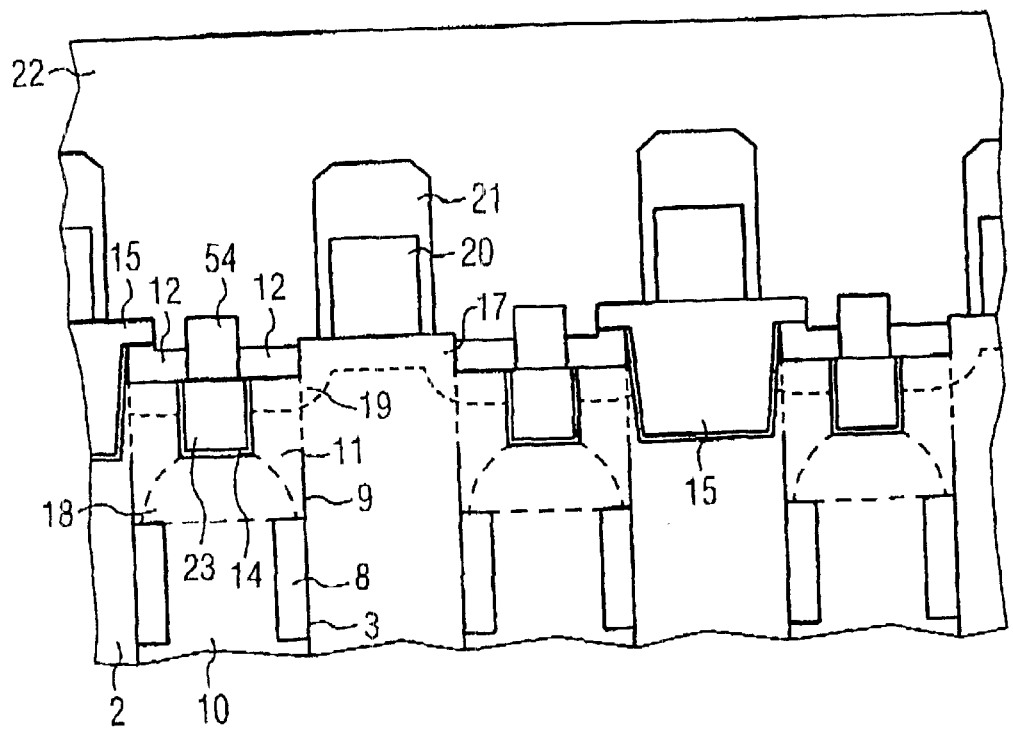

With reference to FIG. 18, a bit line 20 is formed on the substrate surface, so that the bit line 20 runs partly on the insulating trench 15 and partly on the active region 17. The bit line 20 is used to connect the active region 17 and hence the top doped region 19 to the bit line. A dielectric sheath 21 is then formed around the bit line 20 in order to insulate it. In addition, a glass layer 22 is formed on the substrate 2. The glass layer normally is made of a highly-doped silicate glass. A nitride-containing CVD layer may optionally be deposited under the glass layer 22. The CVD layer serves as a diffusion barrier for the substrate. The glass layer 22 is used for planarization, since the highly-doped silicate glass runs during a temperature step.

Figure 19:
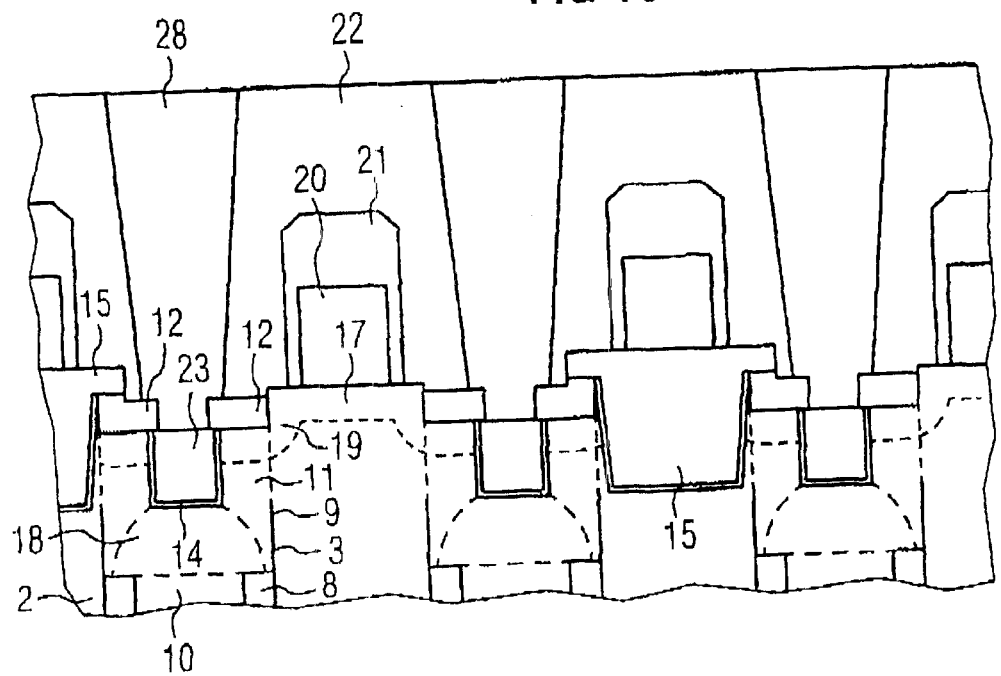

With reference to FIG. 19, a mask for etching the word lines and the contact hole for the gate connection are structured in a photolithographic step. The subsequent etching process etches the doped silicate glass 22 in the region exposed by the mask, and is selective with respect to silicon nitride, so that the gate connection 28 is formed in self-aligned fashion between the bit lines 21 and automatically exposes the internal opening in the second dielectric layer 12. During this etching step, the gate material 23 is exposed. A conductive material 28 is used to connect the gate material to the word line 24 formed in the process.

Figure 20:
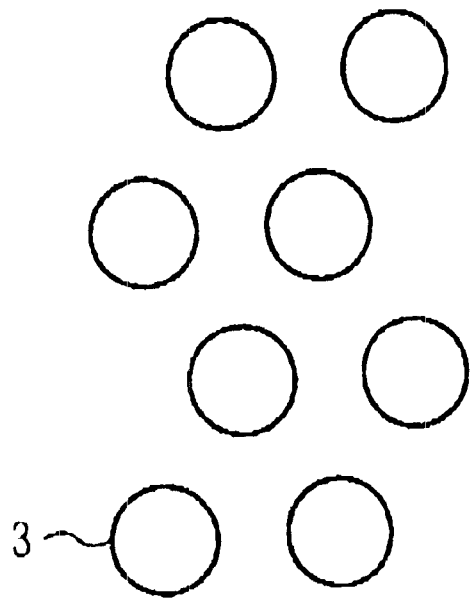
FIG. 20 shows a plan view of a configuration of trenches.

FIG. 20 shows the hexagonal configuration of memory trenches. The trench 3 is also shown.

Figure 21:
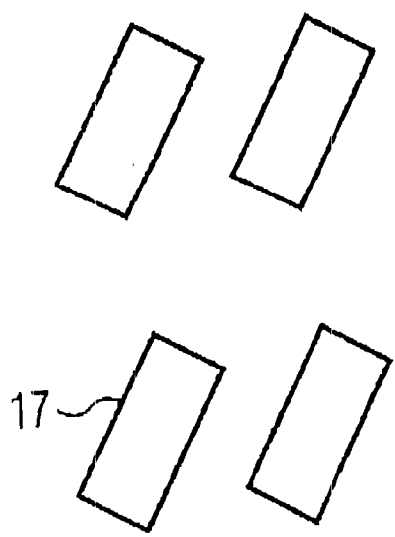
FIG. 21 shows a plan view of a configuration of active regions.

FIG. 21 shows a mask for forming the active regions and marks an active region 17.

Figure 22:
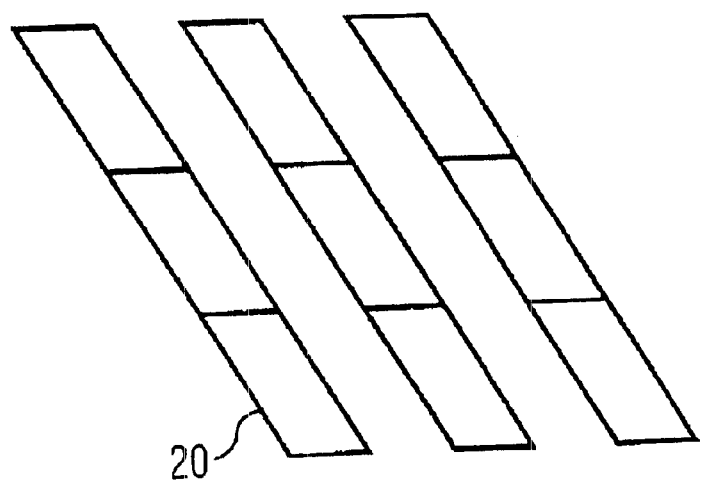
FIG. 22 shows a plan view of a configuration of bit lines.

FIG. 22 shows a first run of bit lines, with the bit line 20 running parallel to the other bit lines.

Figure 23:
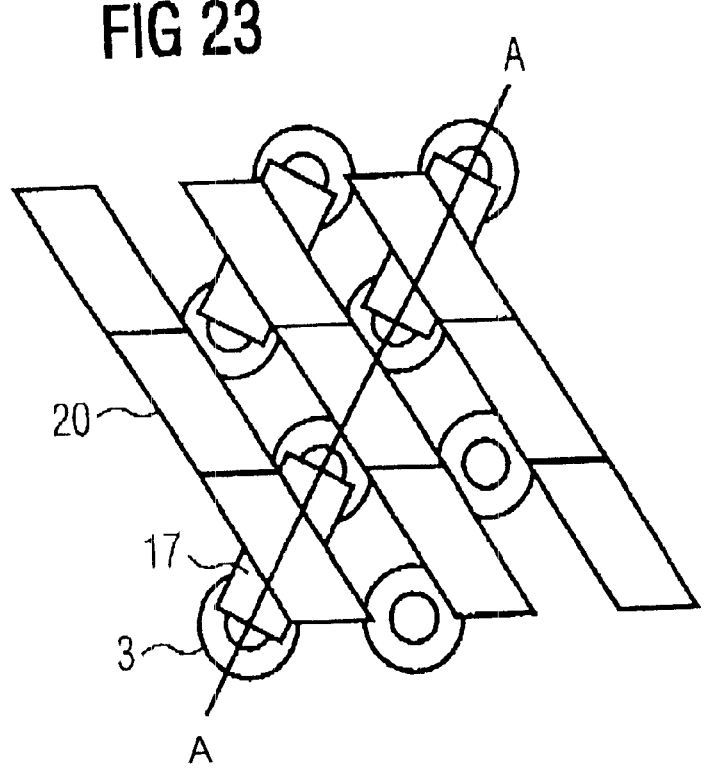
FIG. 23 shows a plan view of a configuration of memory cells.

FIG. 23 shows a combination of FIGS. 20, 21 and 22 with various superimposed elements for the purpose of improved identification of the edge position. Two respective trenches are connected by an active region 17, and the bit line 20 runs partly via the active region 17 and partly via the insulating trench 15.

Figure 24:
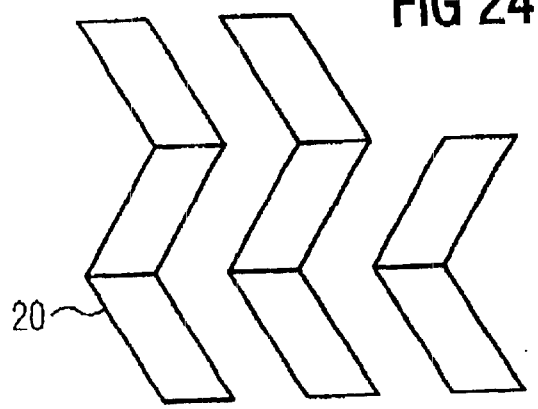
FIG. 24 shows a plan view of a further configuration of bit lines.

FIG. 24 shows a further illustrative embodiment of a bit line configuration. The bit line 20 is configured in a zigzag pattern.

Figure 25:
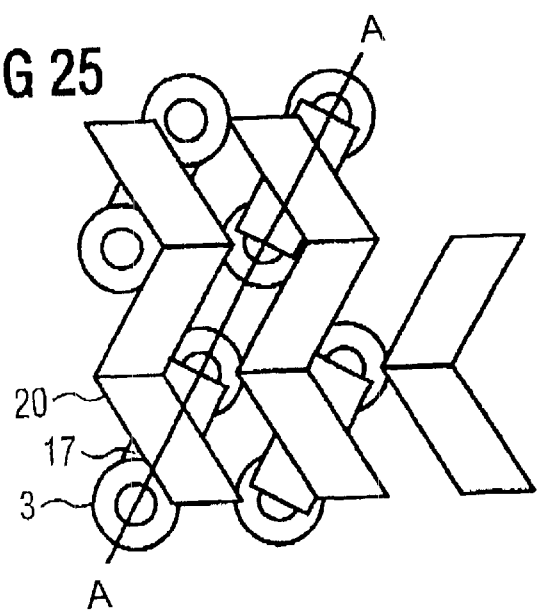
FIG. 25 shows a plan view of a configuration of memory cells.

With reference to FIG. 25, the combination of FIGS. 20, 21 and 24 is shown. The active region 17 of the trench 3 is connected to an adjacent trench and is surrounded by the insulating trench 15. In addition, the run of the bit line 20 is shown, which again runs partly via the active region 17 and via the insulating trench 15. FIG. 23 also shows a section line A—A which cuts the active regions 17 in the longitudinal direction.

Figure 26:
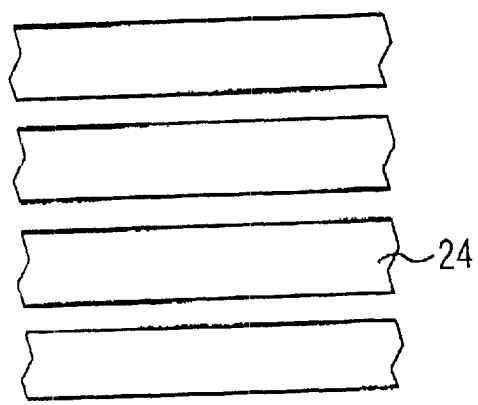
FIG. 26 shows a plan view of a configuration of word lines.

FIG. 26 shows the run of the word lines 24.

One advantage of the invention is that a silicon nitride cover with an internal opening 13 is produced in the trench 3 above the vertical transistor. To clarify the position, FIGS. 23 and 25 each show the internal opening 13 in a few trenches by way of example. Since the bit lines are encased with a nitride 13, for example, it is possible to form the contact for the gate material 23 in self-aligned fashion when the word line 28 is formed between the bit lines and through the internal opening 13. It is also advantageous, according to the invention, to configure the trench 3 not under the intersection of the word line and the bit line, but rather slightly offset with respect thereto.

A particular advantage of the method according to the invention is the great alignment tolerance permitted by the self-aligned process of gate connection production. This makes it possible to produce the word line 28 with a smaller width than the trench 3 and still to make contact with the entire third dielectric layer used as the gate oxide.

Another advantage of the invention is that the internal opening 13 is opened in self-aligned fashion from above, and contact is made with the gate connection 28 in a self-aligned fashion. This allows the trench 3 to be produced with a larger diameter than the minimal structure width, in order to increase the capacitance of the trench 3 thereby.

Another advantage of the method according to the invention is that the gate oxide does not grow out of the trench 3, but is formed only on the epitaxially grown layer 11 in the trench 3. Another advantage of the method according to the invention is that the top doped region 19 is connected to the active region 17. In addition, the bit line 20 runs on the active region 17 and connects it.

Another advantage of the method according to the invention is enclosing the bit line with an insulating sheath. In this case, it is particularly advantageous for the dielectric sheath 21 to be made of silicon nitride, since this can be used as an etching mask during subsequent oxide structuring operations.

Another advantage of the procedure according to the invention is forming the word line in the peripheral area in one and the same method step as the bit line in the cell array. This allows costs to be saved during production of a memory chip.

Another advantage of the method according to the invention is formed by disposing the word line 24 above the bit line 20, as a result of which the coupling capacitance between the word line 24 and the bit line 20 is kept low, and the total capacitance of the bit line 20 is likewise low, which permits the memory cell 1 to be read reliably.

Another advantage is providing the memory trenches 3 in a hexagonal configuration, which utilizes the substrate surface in optimum fashion and increases the capacitance of the trench capacitor.

Optionally, a buried plate may be used as an opposing electrode for the trench capacitor. To this end, dopant is diffused out of the trench, which is filled with a doped material, into the substrate, for example, when the trench capacitor is formed. It is also possible to provide a buried well (buried layer) which connects the buried plates of adjacent trench capacitors.

I claim:

1. A memory cell configuration, comprising:
   a first memory cell and a second memory cell adjacent said first memory cell, said first memory cell including:
   a substrate;

a trench formed in said substrate, said trench having a bottom region, a middle region, a top region, and an inner wall;

an insulating collar disposed on said inner wall in said middle region of said trench;

a dielectric layer disposed at least in said bottom region of said trench;

a conductive trench filling disposed to at least partially fill said bottom region of said trench and said middle region of said trench;

an epitaxially grown layer disposed on said inner wall in said top region of said trench and disposed on said conductive trench filling; and a second dielectric layer disposed above said epitaxially grown layer in said top region of said trench, said second dielectric layer being annular and formed with an internal opening;

an insulating trench formed in said substrate and surrounding said first memory cell and said second memory cell; and an active region formed between said first memory cell and said second memory cell, said active region being doped.

2. The memory cell configuration according to claim 1, comprising a third dielectric layer disposed on said epitaxially grown layer and disposed below said second dielectric layer.

3. The memory cell configuration according to claim 2, comprising a gate material disposed on said third dielectric layer and extending at least to said internal opening formed in said second dielectric layer.

4. The memory cell configuration according to claim 3, comprising:
   a word line;
   a glass layer disposed above said substrate;
   a gate connection disposed on said gate material and extending through said internal opening formed in said second dielectric layer, said gate connection extending through said glass layer to said word line.

5. The memory cell configuration according to claim 4, wherein said gate connection is a self-aligned structure.

6. The memory cell configuration according to claim 5, comprising a bit line running through said active region and contacting said active region, said word line running above said bit line.

7. The memory cell configuration according to claim 4, comprising a bit line running through said active region and contacting said active region, said word line running above said bit line.

8. The memory cell configuration according to claim 1, wherein said epitaxially grown layer includes a bottom doped region that is connected to said conductive trench filling, and said epitaxially grown layer includes a top doped region that is connected to said active region.

9. The memory cell configuration according to claim 1, comprising a bit line running through said active region and making contact with said active region.

10. The memory cell configuration according to claim 9, comprising a dielectric sheath encapsulating said bit line.

11. The memory cell configuration according to claim 1, comprising a glass layer disposed above said substrate.

12. The memory cell configuration according to claim 1, comprising:
    a circuit peripheral area having transistors with gate electrodes; and
    a bit line running through said active region and making contact with said active region;
    said gate electrodes formed with said bit line in one process step.

13. The memory cell configuration according to claim 1, wherein said trench defines a first trench and said insulating trench defines a second trench, and comprising additional trenches disposed adjacent said first trench in a hexagonal pattern.

* * * * *